(12) United States Patent
Park (10) Patent No.: US 8,775,978 B2
(45) Date of Patent: Jul. 8, 2014

(54) SELECTIVE SHIELDING FOR MULTIPLE EXPOSURE MASKS

(75) Inventor: Jea-Woo Park, Warrenton, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/160,173

(22) Filed: Jun. 14, 2011

(65) Prior Publication Data

US 2011/0252385 A1 Oct. 13, 2011

Related U.S. Application Data

(62) Division of application No. 11/610,414, filed on Dec. 13, 2006, now Pat. No. 7,966,585.

(51) Int. Cl.
*G06F 17/50* (2006.01)

(52) U.S. Cl.
USPC .................... 716/50; 716/53; 716/54; 716/55

(58) Field of Classification Search
USPC .............................................. 716/50, 53–55
See application file for complete search history.

(56) References Cited

U.S. PATENT DOCUMENTS

| | | | |
|---|---|---|---|
| 4,532,650 A | 7/1985 | Wihl et al. | |
| 4,762,396 A | 8/1988 | Dumant et al. | |
| 5,396,584 A | 3/1995 | Lee et al. | |
| 5,502,654 A | 3/1996 | Sawahata | |
| 5,655,110 A | 8/1997 | Krivokapic et al. | |
| 5,723,233 A | 3/1998 | Garza et al. | |
| 5,815,685 A | 9/1998 | Kamon | |
| 5,825,647 A | 10/1998 | Tsudaka | |
| 5,879,844 A | 3/1999 | Yamamoto et al. | |
| 5,991,006 A | 11/1999 | Tsudaka | |
| 6,016,357 A | 1/2000 | Neary et al. | |
| 6,033,814 A | 3/2000 | Burdorf et al. | |
| 6,042,257 A | 3/2000 | Tsudaka | |
| 6,049,660 A | 4/2000 | Ahn et al. | |
| 6,077,310 A | 6/2000 | Yamamoto et al. | |
| 6,080,527 A | 6/2000 | Huang et al. | |
| 6,120,952 A | 9/2000 | Pierrat et al. | |
| 6,128,067 A | 10/2000 | Hashimoto | |
| 6,187,483 B1 | 2/2001 | Capodieci et al. | |

(Continued)

FOREIGN PATENT DOCUMENTS

| | | |
|---|---|---|
| JP | 09319067 | 12/1997 |
| JP | 11-102380 | 4/1999 |

(Continued)

OTHER PUBLICATIONS

Adam et al., "Improved Modeling Performance with an Adapted Vectorial Formulation of the Hopkins imaging Equation," *Proc. SPIE: Optical Microlithography XVI*, vol. 5040, pp. 78-91 (Feb. 25, 2003).

(Continued)

*Primary Examiner* — Naum Levin
(74) *Attorney, Agent, or Firm* — Klarquist Sparkman LLP

(57) ABSTRACT

A system for preparing mask data to create a desired layout pattern on a wafer with a multiple exposure photolithographic printing system. In one embodiment, boundaries of features are expanded to create shields for those features, or portions thereof, that are not oriented in a direction that are printed with greater fidelity by an illumination pattern used in the multiple exposure printing system.

33 Claims, 4 Drawing Sheets

Split Layer for DipoleX

Split Layer for DipoleY

(56) References Cited

U.S. PATENT DOCUMENTS

| | | | |
|---|---|---|---|
| 6,243,855 B1 | 6/2001 | Kobayashi et al. | |
| 6,249,904 B1 | 6/2001 | Cobb | |
| 6,263,299 B1 | 7/2001 | Aleshin et al. | |
| 6,269,472 B1 | 7/2001 | Garza et al. | |
| 6,285,783 B1 | 9/2001 | Isomura et al. | |
| 6,301,697 B1 | 10/2001 | Cobb | |
| 6,370,679 B1 | 4/2002 | Chang et al. | |
| 6,415,421 B2 | 7/2002 | Anderson et al. | |
| 6,425,113 B1 | 7/2002 | Anderson et al. | |
| 6,425,117 B1 | 7/2002 | Pasch et al. | |
| 6,430,737 B1 | 8/2002 | Cobb et al. | |
| 6,453,452 B1 | 9/2002 | Chang et al. | |
| 6,453,457 B1 | 9/2002 | Pierrat et al. | |
| 6,467,076 B1 | 10/2002 | Cobb | |
| 6,499,003 B2 | 12/2002 | Jones et al. | |
| 6,503,666 B1 | 1/2003 | Pierrat | |
| 6,516,459 B1 | 2/2003 | Sahouria | |
| 6,553,562 B2 | 4/2003 | Capodieci et al. | |
| 6,574,784 B1 | 6/2003 | Lippincott et al. | |
| 6,584,610 B1 | 6/2003 | Wu et al. | |
| 6,620,561 B2 | 9/2003 | Winder et al. | |
| 6,643,616 B1 | 11/2003 | Granik et al. | |
| 6,649,309 B2 | 11/2003 | Mukherjee | |
| 6,668,367 B2 | 12/2003 | Cobb et al. | |
| 6,670,081 B2* | 12/2003 | Laidig et al. | 430/5 |
| 6,681,379 B2 | 1/2004 | Pierrat | |
| 6,748,578 B2 | 6/2004 | Cobb | |
| 6,785,879 B2 | 8/2004 | Pierrat | |
| 6,787,271 B2 | 9/2004 | Cote et al. | |
| 6,792,590 B1 | 9/2004 | Pierrat et al. | |
| 6,811,935 B2 | 11/2004 | Pierrat | |
| 6,817,003 B2 | 11/2004 | Lippincott et al. | |
| 6,857,109 B2 | 2/2005 | Lippincott | |
| 6,861,204 B2 | 3/2005 | Cote et al. | |
| 6,883,158 B1 | 4/2005 | Sandstrom et al. | |
| 6,887,633 B2 | 5/2005 | Tang | |
| 6,901,574 B2 | 5/2005 | LaCour et al. | |
| 6,901,575 B2 | 5/2005 | Wu et al. | |
| 6,915,505 B2* | 7/2005 | Hsu et al. | 716/53 |
| 6,928,634 B2 | 8/2005 | Granik et al. | |
| 6,973,633 B2 | 12/2005 | Lippincott et al. | |
| 6,978,436 B2 | 12/2005 | Cote et al. | |
| 7,010,776 B2 | 3/2006 | Gallatin et al. | |
| 7,013,439 B2 | 3/2006 | Robles et al. | |
| 7,017,141 B2 | 3/2006 | Anderson et al. | |
| 7,024,655 B2 | 4/2006 | Cobb | |
| 7,028,284 B2 | 4/2006 | Cobb et al. | |
| 7,028,285 B2 | 4/2006 | Cote et al. | |
| 7,047,516 B2 | 5/2006 | Futatsuya | |
| 7,069,534 B2 | 6/2006 | Sahouria et al. | |
| 7,073,162 B2 | 7/2006 | Cobb et al. | |
| 7,138,212 B2* | 11/2006 | Hsu et al. | 430/5 |
| 7,147,975 B2* | 12/2006 | Misaka | 430/5 |
| 7,155,699 B2 | 12/2006 | Cobb | |
| 7,165,234 B2 | 1/2007 | Pierrat | |
| 7,181,721 B2 | 2/2007 | Lippincott et al. | |
| 7,216,331 B2 | 5/2007 | Wu et al. | |
| 7,237,221 B2 | 6/2007 | Granik et al. | |
| 7,240,305 B2 | 7/2007 | Lippincott | |
| 7,240,321 B2 | 7/2007 | Cobb et al. | |
| 7,246,342 B2* | 7/2007 | Hsu et al. | 716/53 |
| 7,281,226 B2 | 10/2007 | Wu et al. | |
| 7,281,234 B2 | 10/2007 | Lippincott | |
| 7,293,249 B2 | 11/2007 | Robles et al. | |
| 7,312,003 B2 | 12/2007 | Cote et al. | |
| 7,324,930 B2 | 1/2008 | Cobb | |
| 7,348,108 B2 | 3/2008 | Cote et al. | |
| 7,367,009 B2 | 4/2008 | Cobb et al. | |
| 7,435,513 B2 | 10/2008 | Cote et al. | |
| 7,458,059 B2 | 11/2008 | Stirniman et al. | |
| 7,500,217 B2 | 3/2009 | Cote et al. | |
| 7,666,554 B2* | 2/2010 | Hsu et al. | 430/5 |
| 7,681,171 B2* | 3/2010 | Chen et al. | 716/50 |
| 7,824,826 B2 | 11/2010 | Hsu et al. | |
| 7,966,585 B2 | 6/2011 | Park | |
| 8,209,642 B2 | 6/2012 | Park | |
| 2004/0005089 A1 | 1/2004 | Robles et al. | |
| 2004/0063000 A1 | 4/2004 | Maurer et al. | |
| 2004/0142251 A1 | 7/2004 | Hsu et al. | |
| 2005/0102648 A1* | 5/2005 | Hsu et al. | 716/19 |
| 2005/0149901 A1 | 7/2005 | Tang | |
| 2005/0251771 A1 | 11/2005 | Robles | |
| 2005/0278686 A1 | 12/2005 | Word et al. | |
| 2006/0188796 A1 | 8/2006 | Word | |
| 2006/0199084 A1 | 9/2006 | Word | |
| 2006/0200790 A1 | 9/2006 | Shang et al. | |
| 2006/0240342 A1 | 10/2006 | Tang | |
| 2006/0277521 A1 | 12/2006 | Chen et al. | |
| 2006/0288325 A1 | 12/2006 | Miyamoto et al. | |
| 2007/0074143 A1 | 3/2007 | Cobb et al. | |
| 2007/0118826 A1 | 5/2007 | Lippincott | |
| 2007/0124708 A1 | 5/2007 | Robles et al. | |
| 2007/0245291 A1 | 10/2007 | Wu et al. | |
| 2008/0020296 A1* | 1/2008 | Hsu et al. | 430/5 |
| 2008/0076042 A1 | 3/2008 | Cote et al. | |
| 2008/0141195 A1 | 6/2008 | Robles et al. | |
| 2008/0148217 A1 | 6/2008 | Park et al. | |
| 2008/0166639 A1 | 7/2008 | Park et al. | |
| 2008/0307381 A1 | 12/2008 | Tritchkov et al. | |
| 2009/0125867 A1 | 5/2009 | Cote et al. | |
| 2010/0050149 A1 | 2/2010 | Cote et al. | |
| 2011/0246953 A1 | 10/2011 | Park | |

FOREIGN PATENT DOCUMENTS

| | | |
|---|---|---|
| JP | 2004-502961 | 1/2004 |
| WO | WO 99/14637 | 3/1999 |
| WO | WO 99/14638 | 3/1999 |
| WO | WO 01/65315 | 7/2001 |
| WO | WO 01/97096 | 12/2001 |
| WO | WO/02/03140 | 1/2002 |
| WO | WO/02/101468 | 12/2002 |

OTHER PUBLICATIONS

Bailey et al., "Double pattern EDA solutions for 32nm HP and beyond," *Proc. SPIE*, vol. 6521, pp. 65211K-1 through 65211K-12 (2007).

Bailey et al., "Intensive 2D SEM Model Calibration for 45nm and Beyond," *Proc. SPIE*, vol. 6154, 10 pp. (Feb. 21, 2006).

Brist et al., "Illumination Optimization Effects on OPC and MDP," *Proc. SPIE*, vol. 5754, pp. 1179-1189 (Mar. 1, 2005).

Brist et al., "Source Polarization and OPC Effects on Illumination Optimization," *Proc. SPIE, 25th Annual BACUS Symposium on Photomask Technology*, vol. 5992, pp. 599232-1/9 (Oct. 3, 2005).

Brist et al., "Effective Multi-cutline QUASAR Illumination Optimization for SRAM and Logic," *Proc. SPIE: Design and Process Integration for Microelectronic Manufacturing*, vol. 5042, pp. 153-159 (Feb. 27, 2003).

Chen et al., "RET Masks for the Final Frontier of Optical Lithography," *Proc. SPIE: Photomask and Next-Generation Lithography Mask Technology XII*, vol. 5853, pp. 168-179 (Apr. 13, 2005).

Cobb et al., "Experimental Results on Optical Proximity Correction With Variable Threshold Resist Model," *Proc. SPIE: Symposium on Optical Microlithography X*, vol. 3051, pp. 458-468 (Mar. 10-14, 1997).

Cobb et al., "Fast Sparse Aerial Image Calculation for OPC," *Proc. SPIE: 15th Annual BACUS Symposium on Photomask Technology and Management*, vol. 2621, pp. 534-545 (Sep. 20-22, 1995).

Cobb et al., "Fast, Low-Complexity Mask Design," *Proc. SPIE: Symposium on Optical/Laser Microlithography VIII*, vol. 2440, pp. 313-327 (Feb. 22-24, 1995).

Cobb et al., "Large Area Phase-Shift Mask Design," *Proc. SPIE, Symposium on Optical/Laser Microlithography VII*, vol. 2197, pp. 348-360 (Mar. 2-4, 1994).

Cobb et al., "Mathematical and CAD Framework for Proximity Correction," *Proc. SPIE: Symposium on Optical Microlithography IX*, vol. 2726, pp. 208-222 (Mar. 13-15, 1996).

Cobb et al., "Model-Based OPC Using the MEEF Matrix," *Proc. SPIE, 22nd Annual BACUS Symposium on Photomask Technology*, vol. 4889, 10 pp. (Sep. 30-Oct. 4, 2002).

(56) References Cited

OTHER PUBLICATIONS

Cobb et al., "OPC Methods to Improve Image Slope and Process Window," *Proc. SPIE: Design and Process Integration for Microelectronic Manufacturing*, vol. 5042, pp. 116-125 (Feb. 27, 2003).

Cobb et al., "Using OPC to Optimize for Image Slope and Improve Process Window," *Proceeding of SPIE, Photomask Japan*, vol. 5130, pp. 838-846 (Apr. 16-18, 2003).

Cobb et al., "New Concepts in OPC," *Proc. SPIE: Optical Microlithography XVII*, vol. 5377, pp. 680-690 (Feb. 24, 2004).

Cobb, "Flexible Sparse and Dense OPC Algorithms," *Proc. SPIE, Photomask and Next-Generation Lithography Mask Technology XII*, vol. 5853, pp. 693-702 (Apr. 13, 2005).

Granik et al., "MEEF as a Matrix," *Proc. SPIE: 21st Annual BACUS Symposium on Photomask Technology*, vol. 4562, pp. 980-991 (Oct. 2-5, 2001).

Granik et al., "Two-Dimensional G-MEEF Theory and Applications," *Proc. SPIE: Symposium on Photomask and Next-Generation Lithography Mask Technology IX*, vol. 4754, pp. 146-155 (Apr. 23-25, 2002).

Granik et al., "Universal process modeling with VTRE for OPC," *Proc. SPIE: Optical Microlithography XV*, vol. 4691, pp. 377-394 (Mar. 5, 2002).

Granik, "Generalized MEEF Theory," *Interface* 2001, 13 pp. (Nov. 2001).

Granik, "New Process Models for OPC at sub-90nm Nodes," *Proc. SPIE: Optical Microlithography XVI*, vol. 5040, pp. 1166-1175 (Feb. 25, 2003).

Granik, "Solving Inverse Problems of Optical Microlithography," *Proc. SPIE: Optical Microlithography XVIII*, vol. 5754, pp. 506-526 (Mar. 1, 2005).

Hong et al., "Impact of Process Variance on 65 nm Across-Chip Linewidth Variation," *Proc. SPIE: Design and Process Integration for Microelectronic Manufacturing IV*, vol. 6156, pp. 61560Q1-9 (Feb. 23, 2006).

Liebmann, "Layout Methodology Impact of Resolution Enhancement Technique," *Electronic Design Process*, 7 pp. (2003).

Lucas et al., "Reticle Enhancement Verification for 65 nm and 45 nm Nodes," *Proc. SPIE: Design and Process Integration for Microelectronic Manufacturing IV*, vol. 6156, pp. 61560Q1-9 (Feb. 23, 2006).

Maenhoudt et al., "Double Patterning Scheme for Sub-0.25 k1 Single Damascene Structures," *Proc. SPIE: Optical Microlithography XVIII*, vol. 5754, pp. 1508-1518 (Mar. 1, 2005).

Maurer et al., "Evaluation of a Fast and Flexible OPC Package: OPTISSIMO," *Proc. SPIE: 16th Annual Symposium on Photomask Technology and Management*, vol. 2884, pp. 412-418 (Sep. 18-20, 1996).

Maurer et al., "Process Proximity Correction Using an Automated Software Tool," *Proc. SPIE: Optical Microlithography XI*, vol. 3334, pp. 245-253 (Feb. 22-27, 1998).

Mentor Graphics Corporation, News and Views, "Calibre," including a partial translation, 9 pp. (document marked Apr. 2000).

Mentor Graphics Corporation, News and Views, "DSM Verification and Analysis," including a partial translation, 7 pp. (document marked Mar. 1999).

Mentor Graphics Corporation, News and Views, "OPC," including a partial translation, 11 pp. (document marked Mar. 1999).

Ohnuma et al., "Lithography Computer Aided Design Technology for Embedded Memory in Logic," *Japanese Journal of Applied Physics*, vol. 37(12B), pp. 6686-6688 (Dec. 1998).

Op de Beeck et al., "Manufacturability issues with double patterning for 50-nm half-pitch single damascene applications using Relacs shrink and corresponding OPC," *Proc. SPIE*, vol. 6520, pp. 65200I-1 through 65200I-13 (2007).

Park et al., "Application Challenges with Double Patterning Technology Beyond 45 nm," *Proc. SPIE: Photomask Technology 2006*, vol. 6349, pp. 634922-1 through 634922-12 (Sep. 19, 2006).

Park et al., "Robust Double Exposure Flow for Memory," 11 pp. (also published as Park et al., "Robust Double Exposure Flow for Memory," *Proc. SPIE: Optical Microlithography XIX*, vol. 6154, pp. 808-817 (Feb. 19, 2006)).

Schellenberg, "Sub-Wavelength Lithography Using OPC," *Semiconductor Fabtech*, 9th ed., pp. 205-209 (Mar. 1999).

Torres et al. "RET—Compliant Cell Generation for Sub-130 nm Processes," *Proc. SPIE: Optical Microlithography XV*, vol. 4691, pp. 529-539 (Mar. 5, 2002).

Torres et al., "Design Verification Flow for Model-Assisted Double Dipole Decomposition," *Proc. SPIE: Optical Microlithography XV*, vol. 4691, pp. 585-592 (Mar. 5, 2002).

Torres et al., "Model Assisted Double Dipole Decomposition," *Proc. SPIE: Optical Microlithography XV*, vol. 4691, pp. 407-417 (Mar. 5, 2002).

Wiaux et al., "193 nm Immersion Lithography Towards 32 nm hp Using Double Patterning," *3rd International Symposium on Immersion Lithography*, 23 pp. (Oct. 2-5, 2006).

Word et al. "Advanced Layout Fragmentation and Simulation Schemes for Model Based OPC," *Proc. SPIE: Optical Microlithography XVIII*, vol. 5754, pp. 1159-1168 (Mar. 1, 2005).

* cited by examiner

SELECTIVE SHIELDING FOR MULTIPLE EXPOSURE MASKS

CROSS-REFERENCE TO RELATED APPLICATION

This is a divisional application of prior U.S. patent application Ser. No. 11/610,414 entitled "SELECTIVE SHIELDING FOR MULTIPLE EXPOSURE MASKS," filed Dec. 13, 2006, (now U.S. Pat. No. 7,966,585, issued Jun. 21, 2011), the entire disclosure of which is hereby incorporated herein by reference.

FIELD OF THE INVENTION

The present invention relates to photolithographic processing in general, and in particular to techniques for preparing mask data for use with multiple exposure processing techniques.

BACKGROUND OF THE INVENTION

In conventional photolithographic processing, circuit elements to be created in an integrated circuit are formed by exposing a semiconductor wafer through a photolithographic mask or reticle having a pattern of features formed thereon. The wafer is then chemically and mechanically processed to create the corresponding circuit elements on the wafer.

As the size of the features on the mask or reticle become smaller than the wavelength of light used to expose the mask or reticle, optical and other process distortions can occur such that the shape of the circuit elements created on the wafer may vary substantially from the desired pattern of features. Therefore, most photolithographic processing uses one or more resolution enhancement techniques, such as optical and process correction (OPC), adding sub resolution assist features (SRAFs), etc., to minimize the distortions.

Another technique used to increase the fidelity with which a pattern of circuit elements is created on a wafer is to use different illumination methods. For example, double exposure techniques create a pattern of circuit elements by exposing masks with one illumination pattern that is optimized to print features that are oriented in a particular direction onto the wafer. Another illumination pattern then prints another set of features that are oriented in a different direction in order to create the desired pattern of circuit elements on the wafer. One form of double exposure that is becoming more popular in photolithographic processing is double dipole exposure. With double dipole exposure, a first exposure is performed with a dipole illumination pattern oriented in a first (e.g., X) direction and a second exposure is made with a dipole illumination pattern oriented in a direction perpendicular (i.e., Y) direction to that of the first illumination pattern.

With dipole illumination, features, or portions thereof, of a desired layout print with a better image fidelity when they are oriented perpendicular to the orientation of the dipole illumination pattern. That is, design features that are oriented in a vertical direction are best imaged when exposed with a dipole illumination pattern that is oriented horizontally. Similarly, horizontally oriented features, or portions thereof, are best imaged when exposed with a dipole illumination pattern that is oriented in the vertical direction.

Because most design layouts include features, and portions thereof, that are oriented in both the horizontal and vertical directions, attempts have been made to develop software tools for the production of masks that allow the exposure of features that are better oriented for a particular dipole illumination pattern and prevent the exposure of features that are not optimally oriented. One technique for doing this is to place large shields over the features that are not optimally oriented for the illumination pattern in question. While such a technique can work in theory, it is difficult to develop software algorithms for converting layout data into mask data including shields on a mask. Therefore, there is a need for a system which can automatically analyze a desired layout pattern and prepare mask data for use with multiple exposure fabrication techniques.

SUMMARY OF THE INVENTION

The present invention is a system and method for preparing data for one or more masks to create a desired pattern of circuit elements on a mask with a multiple exposure fabrication technique.

In one embodiment of the invention, mask data is prepared for use with a photolithographic system using a double dipole illumination pattern that prints features with greater fidelity when the features, or portions thereof, are oriented in a direction that is perpendicular to the orientation of the dipole. A computer program analyzes data representing a desired layout pattern and modifies the data by creating shields around the features, or portions thereof, that are not oriented in a direction with which the illumination pattern prints features with greater fidelity. In one embodiment, shields are created by expanding the edge fragments defining the boundaries of the features, or portions thereof, that are not oriented for printing with greater fidelity. In one embodiment, the modified data including features, or portions thereof, that are oriented for printing with greater fidelity and the shielded features, or portions thereof, are subjected to one or more resolution enhancement techniques, such as OPC, to define the mask data.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENTS

As indicated above, the present invention is a system and method for converting layout data into mask data for the creation of one or more masks or reticles that will be used with a multiple exposure photolithographic processing technique. Although the present invention is described with respect to double dipole exposure techniques, it will be appreciated that the present invention can be used with other multiple exposure techniques such as alternating PSM. Although the invention is described with respect to creating mask data, the present invention can also be used to create reticle data. Therefore, for purposes of this invention, the terms are meant to be synonymous.

Figure 1A:
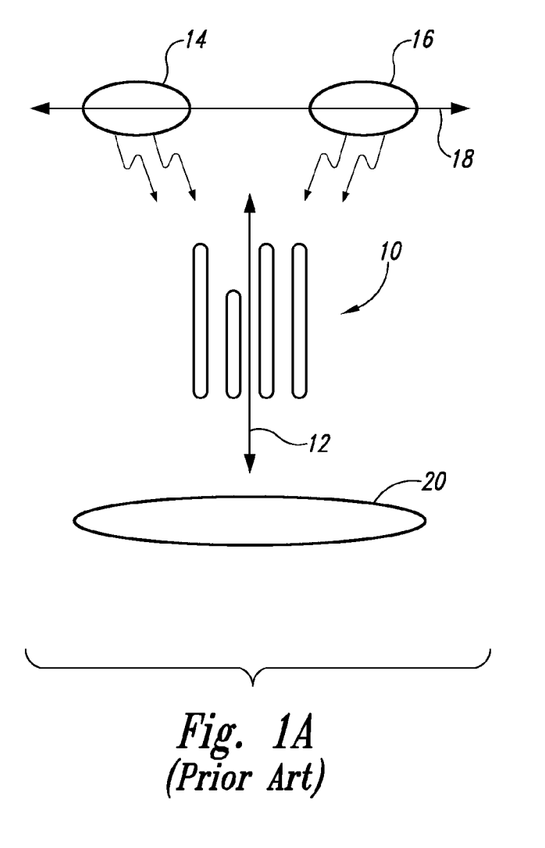
FIGS. 1A and 1B illustrate different orientations of features that are printed with greater fidelity on a wafer by different illumination patterns.
Figure 1B:
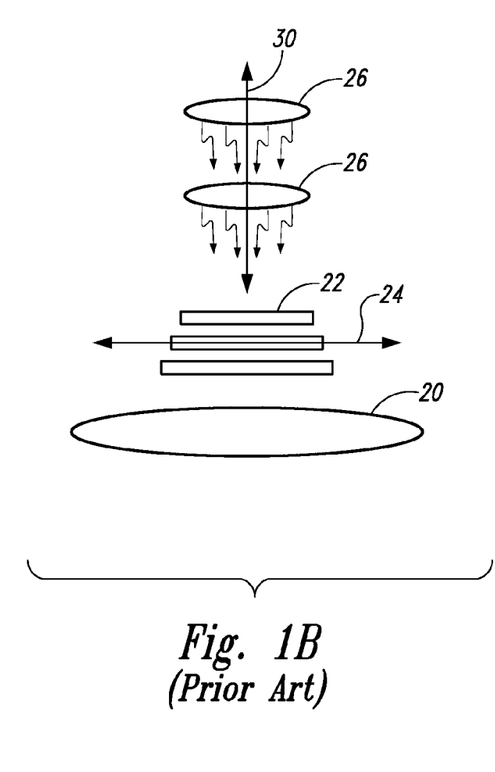

FIG. 1A illustrates a number of features 10 that are contained on a mask and are aligned in the Y direction as indicated by the arrow 12. The features 10 are exposed onto a wafer 20 with a dipole illumination pattern having a pair of light sources 14, 16 that are oriented in the X direction, as indicated by the arrow 18. Upon illumination of the mask features 10, a corresponding pattern will be created on the wafer 20. As will be appreciated by those skilled in the art, the features 10 that are oriented in the X direction are printed with a greater image fidelity than features that are not oriented in a direction perpendicular to the orientation of the dipole illumination pattern. FIG. 1B illustrates a second pattern of features 22 that are oriented in the X direction, as indicated by the arrow 24. The features 22 are exposed with a dipole illumination pattern having light sources 26, 28 that are oriented in the Y direction, as indicated by the arrow 30. The features 22 are printed with a greater image fidelity than features that are not oriented in a direction that is perpendicular to the orientation of the illumination pattern. To create the desired pattern on the wafer, both illumination patterns are used.

Figure 2A:
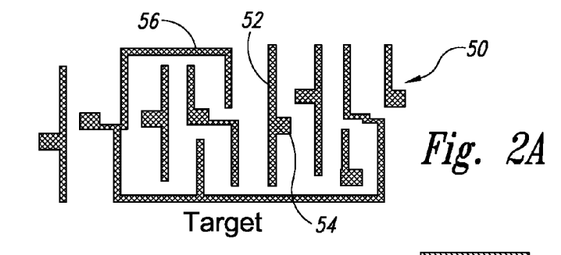
FIGS. 2A-2F illustrate one embodiment of a technique for preparing mask data for use with a multiple exposure photolithographic processes in accordance with the present invention.

In contrast to the simplified examples shown in FIGS. 1A and 1B, FIG. 2A illustrates a more realistic example of a desired layout pattern to be printed on a wafer. As will be appreciated, the desired layout pattern 50 has features that are oriented in the X direction, the Y direction, and some features having portions that are oriented in both the X and Y directions. For example, the feature 52 is generally oriented in a Y direction and will be printed with a greater fidelity by a dipole illumination pattern that is oriented in the X direction. Conversely, a feature 56 that is generally oriented in the X direction is printed with greater fidelity with a dipole illumination pattern that is oriented in a Y direction. A feature 54 can be said to be oriented in both the Y and X directions.

In accordance with one embodiment of the invention, mask data is created by creating shields around those features or portions thereof that are not oriented for printing with increased fidelity with an illumination pattern to be used with the mask.

Figure 3:
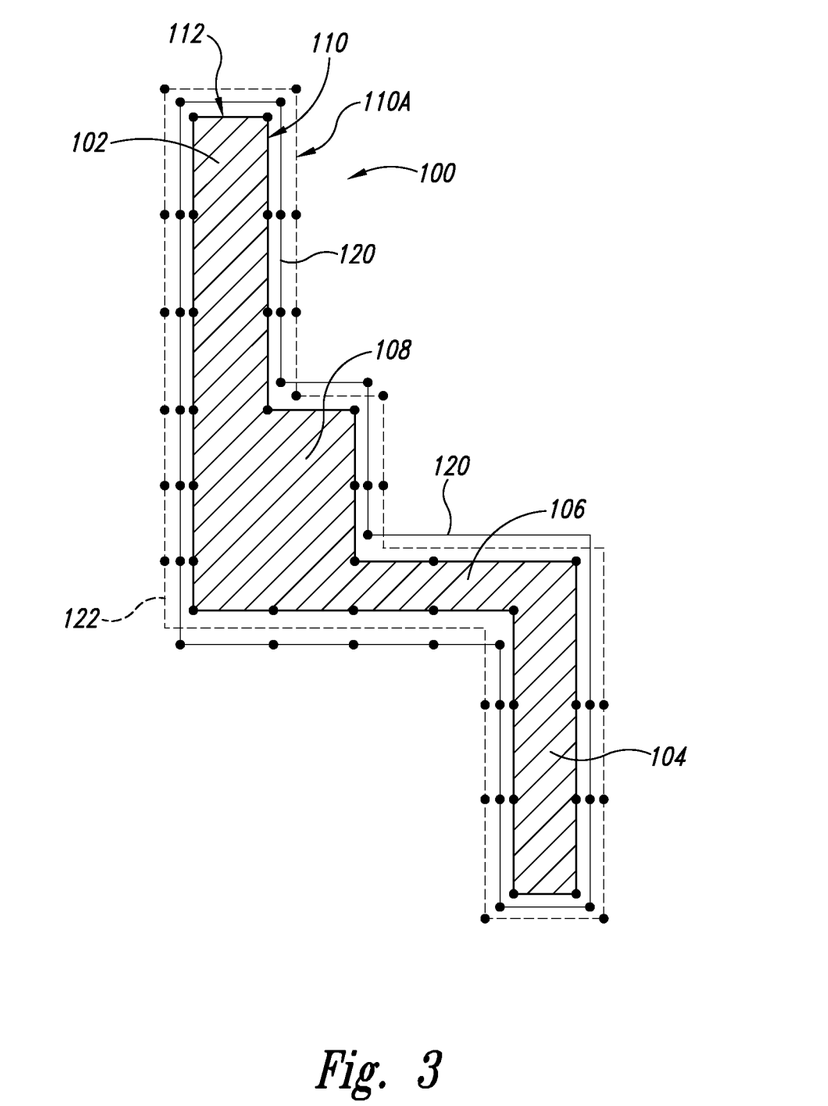
FIG. 3 illustrates a technique for creating shields around a feature, or portion thereof, to be included on a mask in accordance with one embodiment of the present invention.

FIG. 3 illustrates one technique for shielding features, or portions thereof, in a desired layout that are not printed with a greater fidelity by a particular illumination pattern. A feature 100 includes generally vertically oriented portions 102 and 104 and a portion 106 that is generally horizontally oriented. A portion 108 of the feature 100 has edges that are both vertically and horizontally oriented. In one embodiment of the invention, data describing the feature 100 is used to create patterns on two masks designed for different orientations of the illumination pattern.

In accordance with one embodiment of the invention, a computer system reads data that describes the feature 100 from a design layout data file. Features in the design layout data file are typically defined as sequences of vertices defining a polygon in a layout description language such as GDS-II or Oasis™. Upon reading the vertice data, a computer system adds vertices to the polygons in order to define a number of smaller edge fragments 110, 112, etc., that extend around the edges of the polygon that define the feature 100. Each edge fragment is defined by fragmentation endpoints having a known position.

In accordance with one embodiment of the invention, if a feature, or portion thereof, is oriented in a direction which is not printed with a greater fidelity by an illumination pattern of the exposure tool, a shield is placed around the feature, thereby effectively making it larger. For example, the portion 102 of the feature 100 is oriented in the Y direction. For the mask that will be used with a dipole illumination pattern that is also oriented in the Y direction, the edge fragments defining the boundaries of the vertical portion 102 of the feature 100 are biased outwardly by a sufficient amount to create a shield around that portion of the feature. For example, the edge fragment 110 can be biased outward to form an edge fragment 110a for use in creating a mask to be used with an illumination pattern that is oriented in the same direction as that portion 102 of the feature 100. For those features, or portions thereof, that are oriented in a direction that prints the features with a greater fidelity, little or no biasing of the edge fragments is required.

In a typical layout description language, such as GDS-II or Oasis™, each edge fragment defined in a layout database typically includes a parameter indicating the angle of orientation of the edge fragment. For example, in the example shown in FIG. 3, vertically oriented edge fragments such as edge fragment 110 are indicated in the layout description language as being oriented at 90 degrees, while horizontally oriented edge fragments such as edge fragment 112 are indicated as being oriented at 0 degrees. In one embodiment of the invention, a computer program analyzes each edge fragment that defines the perimeter of the feature. To create mask data for use with an illumination pattern that is oriented in the X direction, the edge fragments that are oriented in the Y direction are biased by a little or no amount, while those features that are oriented in the X direction are biased outwardly by a sufficient amount to create a shield around the feature. In one embodiment, edge fragments are biased by 10-20 nanometers. The result is a redefinition of the perimeter of the feature 100 with the edge fragments that are oriented for greater printing fidelity by an intended illumination pattern having little or no shield, and those edge fragments defining portions of the feature that are not oriented for greater printing fidelity by an illumination pattern having a shield. In one embodiment, the modified layout data to be with masks for each illumination pattern are stored in separate data layers of the layout database.

In the example shown, an outline 120 defines the boundaries of the feature for use in creating a mask that will be exposed with an illumination pattern that is oriented in the X direction, while a dotted line 122 indicates the boundaries of the feature for use in creating the mask that will be exposed with an illumination pattern that is oriented in the Y direction.

In one embodiment of the invention, the polygons defined for each mask feature are further corrected with one or more resolution enhancement techniques such as OPC prior to being printed on the masks. In one embodiment, the line ends of a feature are identified by the computer and the edge fragments associated with the line ends are biased outward to compensate for well known line end shortening distortion that occurs during photolithographic processing. Line ends can be detected by an edge fragment having a length that is less than some defined value that is connected to two corner end points. By biasing the line ends outwardly, even if a feature is oriented in the direction of increased printing fidelity by an illumination pattern, the OPC tool can operate more quickly to produce the desired end result.

Figure 2B:
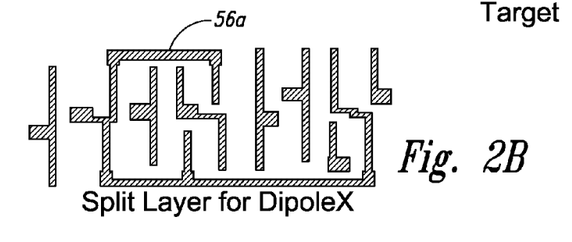
Figure 2C:
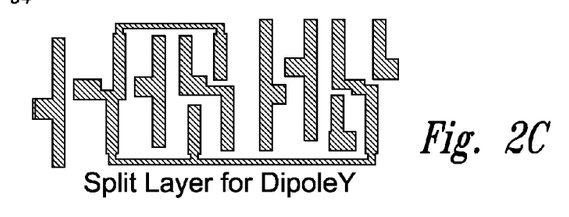

FIGS. 2B and 2C illustrate a number of polygons defined from the original layout data 50 shown in FIG. 2A. The polygons shown in FIG. 2B are redefined to expand the dimension of those features, or portions thereof, that are oriented in the X direction. For example, compare feature 56a shown in FIG. 2B with the original feature 56 shown in FIG.

2A. Those features, or portions thereof, that are oriented in the vertical direction have dimensions that are substantially identical to the original layout data shown in FIG. 2A. FIG. 2C illustrates a number of features, or portions thereof, that are expanded if oriented in the Y direction, while those features, or portions thereof, that are oriented in the X direction have dimensions that are substantially identical to the layout data as shown in FIG. 2A.

Figure 2D:
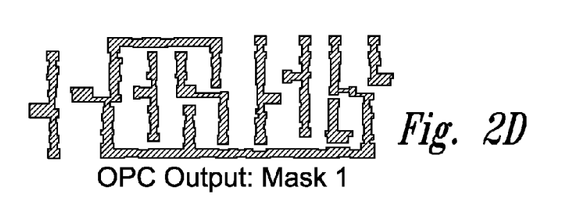
Figure 2E:
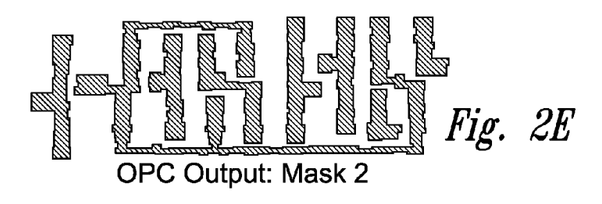
Figure 2F:
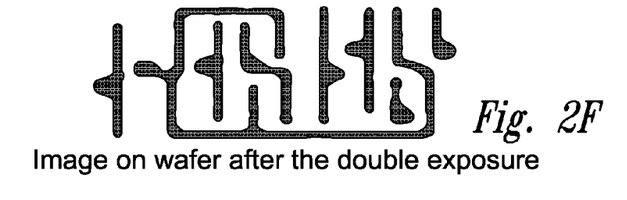

OPC or other resolution enhancement techniques can be applied to the polygons defined for the X illumination pattern mask and the Y illumination pattern mask. FIG. 2D illustrates the results of the OPC-corrected polygons for the X illumination pattern mask, while FIG. 2E illustrates the OPC corrected polygons for use in the Y illumination pattern mask. When used with a double exposure photolithographic process, the result is a number of features printed on a wafer as shown in the simulation of FIG. 2F. As will be appreciated by comparing the simulated pattern shown in FIG. 2F with the desired layout pattern shown in FIG. 2A, the pattern of features created on the wafer closely matches the desired pattern.

Because two masks are used to create a feature, or a portion thereof, on a wafer the OPC tool or other resolution enhancement tool may consider two or more edge fragments on the masks in order to achieve a desired edge placement error (EPE) on the wafer. In one embodiment, two or more edge fragments on both masks are mapped to a single corresponding location on the wafer. In one embodiment, OPC is performed on the edge fragments on both masks in a mariner described in U.S. Pat. Nos. 6,430,737 and 7,028,284, both of which are assigned to Mentor Graphics Corporation, the assignee of the present invention, and incorporated by reference herein.

Figure 4:
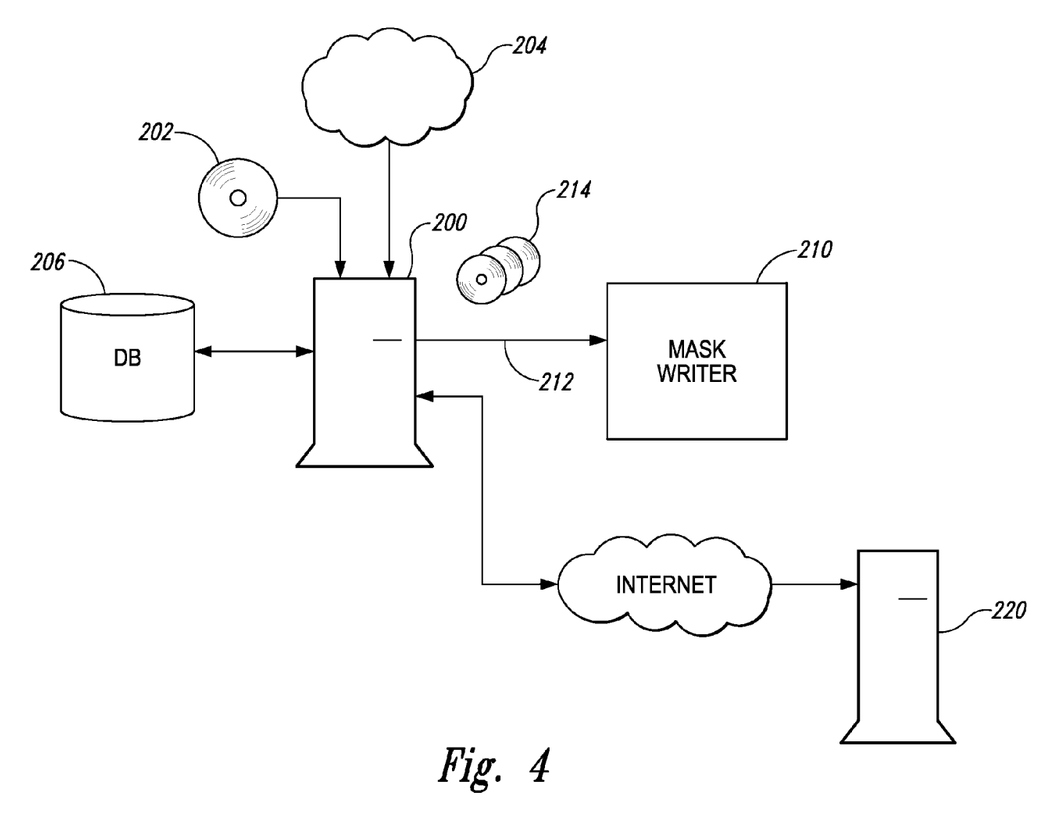
FIG. 4 illustrates a representative computer system for producing mask data in accordance with the present invention.

FIG. 4 illustrates one embodiment of a computer system that can be used to produce the mask data in accordance with the present invention. A computer system 200 receives a sequence of executable instructions on a computer-readable media 202 or from a communication link 204 such as a local or wide area network including the Internet. Upon executing the instructions, the computer system 200 reads a desired layout from a database 206 or other computer-readable media. The computer system operates to produce mask data for use in creating photolithographic masks or reticles for each of the illumination patterns in the manner described above. The completed mask data is transmitted to a mask writer 210 via a communication link 212 or on one or more computer-readable media 214.

In one embodiment of the invention, the computer system 200 reads the desired layout from the database 206 and transmits the layout data to a remote computer 220, which may be inside or outside the United States. The remote computer system 220 calculates the mask data in accordance with the techniques described above and returns the mask data to the computer system 200 or transmits the mask data in a computer-readable form to the mask writer 210.

As will be appreciated, the present invention provides a simple technique for creating mask data to print a desired pattern of features on a wafer with a multiple exposure technique. In one embodiment of the invention, each feature in the desired layout pattern is included in the mask data for the masks to be used with different illumination patterns. In some embodiments, features that are oriented in a single direction may be used to create data for masks to be used with an illumination pattern that is optimized to print features in that direction but not used to create data for masks that will be used with another illumination pattern.

While illustrative embodiments have been illustrated and described, it will be appreciated that various changes can be made therein without departing from the scope of the invention. It is therefore intended that the scope of the invention be determined from the following claims and equivalents thereof.

The embodiments of the invention in which an exclusive property or privilege is claimed are defined as follows:

1. A method of preparing data for a mask for printing a target pattern on a wafer with a photolithographic process, comprising:
   by a computer, receiving modified data from a remote computer, wherein the modified data represents a number of polygons that define a target pattern of illumination features to be printed on the wafer with the mask, and wherein one or more of the polygons defining illumination features oriented in a first direction are expanded in the target pattern associated with the received modified data, and one or more of the polygons defining illumination features oriented in a second direction are not expanded in the target pattern associated with the received modified data.

2. The method of claim 1, further comprising transmitting the mask data for printing the target pattern to the remote computer, wherein the modified data is generated by the remote computer.

3. The method of claim 1, wherein at least one of the polygons defining features oriented in the first direction is modified by optical and process correction (OPC).

4. The method of claim 3, wherein at least one of the polygons modified by the optical and process correction (OPC) has one or more line ends extended.

5. The method of claim 1, wherein the polygons defining features oriented in a first direction are expanded outwardly by a substantially identical amount.

6. The method of claim 1, wherein:
   the mask is a first mask;
   the modified data is modified data for the first mask; and
   the method further comprises receiving modified data for a second mask from a remote computer, wherein:
   the modified data for the second mask represents a number of polygons that define a target pattern of features to be printed on the wafer with the second mask, and
   the polygons defining features oriented in the second direction are expanded in the modified data for the second mask and the polygons defining features oriented in the first direction are not expanded in the modified data for the second mask.

7. The method of claim 1, wherein:
   the mask is a first mask;
   the modified data is modified data for the first mask;
   the method further comprises receiving modified data for a second mask from a remote computer;
   wherein the target pattern of features includes polygons defining features that are oriented in both the first direction and the second direction; and
   the polygons defining the features that are not oriented in either the first direction or the second direction are expanded in the modified data for the first mask and are expanded in the modified data for the second mask.

8. The method of claim 1, further comprising manufacturing a mask using the modified data.

9. The method of claim 1, further comprising manufacturing a circuit using the modified data.

10. The method of claim 1, wherein at least one of the polygons defining features oriented in the first direction is modified by a resolution enhancement technique.

11. One or more computer-readable storage media storing a sequence of program instructions that causes a computer to perform a method, the method comprising:
receiving modified data from a remote computer, the modified data representing a number of polygons that define a target pattern of illumination features to be printed on a wafer with a mask, wherein one or more of the polygons defining illumination features oriented in a first direction are expanded in the target pattern associated with the received modified data, and one or more of the polygons defining illumination features oriented in a second direction are not expanded in the target pattern associated with the received modified data.

12. The computer-readable storage media of claim 11, wherein the method further comprises transmitting mask data for printing the target pattern to the remote computer, wherein the modified data is generated by the remote computer.

13. The computer-readable storage media of claim 11, wherein the polygons defining features oriented in a first direction are expanded outwardly by a substantially identical amount.

14. The computer-readable storage media of claim 11, wherein:
the mask is a first mask;
the modified data is modified data for the first mask; and
the method further comprises receiving modified data for a second mask from a remote computer, wherein:
the modified data for the second mask represents a number of polygons that define a target pattern of features to be printed on the wafer with the second mask, and
the polygons defining features oriented in the second direction are expanded in the modified data for the second mask and the polygons defining features oriented in the first direction are not expanded in the modified data for the second mask.

15. The computer-readable storage media of claim 1, wherein:
the mask is a first mask;
the modified data is modified data for the first mask;
the method further comprises receiving modified data for a second mask from a remote computer;
wherein the target pattern of features includes polygons defining features that are oriented in both the first direction and the second direction; and
the polygons defining the features that are not oriented in either the first direction or the second direction are expanded in the modified data for the first mask and are expanded in the modified data for the second mask.

16. A method of preparing data for a mask for printing a target pattern on a wafer with a photolithographic process, comprising:
by a computer, receiving modified data from a remote computer, wherein the modified data represents a number of polygons that define a target pattern of illumination features to be printed on the wafer with the mask, and wherein polygons defining illumination features oriented in a first direction have edges that have been outwardly expanded in the target pattern associated with the received modified data, and polygons defining illumination features oriented in a second direction have edges that have not been outwardly expanded in the target pattern associated with the received modified data.

17. The method of claim 16, further comprising transmitting the mask data for printing the target pattern to the remote computer, wherein the modified data is generated by the remote computer.

18. The method of claim 16, wherein at least one of the polygons defining features oriented in the first direction has one or more edges that have been modified by optical and process correction (OPC).

19. The method of claim 18, wherein at least one of the polygons modified by the optical and process correction (OPC) has one or more line ends extended.

20. The method of claim 16, wherein the expanded edges are expanded outwardly by a substantially identical amount.

21. The method of claim 16, wherein:
the mask is a first mask;
the modified data is modified data for the first mask; and
the method further comprises receiving modified data for a second mask from a remote computer, wherein:
the modified data for the second mask represents a number of polygons that define a target pattern of features to be printed on the wafer with the second mask, and
the polygons defining features oriented in the second direction have edges that have been outwardly expanded in the modified data for the second mask.

22. The method of claim 16, wherein:
the mask is a first mask;
the modified data is modified data for the first mask;
the method further comprises receiving modified data for a second mask from a remote computer;
wherein the target pattern of features includes polygons defining features that are oriented in both the first direction and the second direction; and
the polygons defining the features that are not oriented in either the first direction or the second direction have edges that have been outwardly expanded in the modified data for the first mask and have edges that have been outwardly expanded in the modified data for the second mask.

23. The method of claim 16, further comprising manufacturing a mask using the modified data.

24. The method of claim 16, further comprising manufacturing a circuit using the modified data.

25. The method of claim 16, wherein at least one of the polygons defining features oriented in the first direction has one or more edges that have been modified by a resolution enhancement technique.

26. One or more computer-readable storage media storing a sequence of program instructions that causes a computer to perform a method, the method comprising:
receiving modified data from a remote computer, wherein the modified data represents a number of polygons that define a target pattern of illumination features to be printed on a wafer with a mask, and wherein polygons defining illumination features oriented in a first direction have edges that have been outwardly expanded in the target pattern associated with the received modified data, and polygons defining illumination features oriented in a second direction have edges that have not been outwardly expanded in the target pattern associated with the received modified data.

27. The computer-readable storage media of claim 26, wherein the method further comprises transmitting the mask data for printing the target pattern to the remote computer, wherein the modified data is generated by the remote computer.

28. The computer-readable storage media of claim 26, wherein the expanded edges are expanded outwardly by a substantially identical amount.

29. The computer-readable storage media of claim 26, wherein:
the mask is a first mask;

the modified data is modified data for the first mask; and the method further comprises receiving modified data for a second mask from a remote computer, wherein:

the modified data for the second mask represents a number of polygons that define a target pattern of features to be printed on the wafer with the second mask, and the polygons defining features oriented in the second direction have edges that have been outwardly expanded in the modified data for the second mask.

30. The computer-readable storage media of claim 26, wherein:

the mask is a first mask;

the modified data is modified data for the first mask;

the method further comprises receiving modified data for a second mask from a remote computer;

wherein the target pattern of features includes polygons defining features that are oriented in both the first direction and the second direction; and the polygons defining the features that are not oriented in either the first direction or the second direction have edges that have been outwardly expanded in the modified data for the first mask and have edges that have been outwardly expanded in the modified data for the second mask.

31. A method, comprising:

by a computer:

transmitting data for a target pattern of illumination features to be printed on a wafer with a mask to a remote computer; and receiving modified data from the remote computer, wherein:

the modified data represents the target pattern of illumination features, one or more of the illumination features oriented in a first direction are expanded in the target pattern associated with the received modified data, and one or more of the illumination features oriented in a second direction are not expanded in the target pattern associated with the received modified data.

32. The method of claim 31, wherein the modified data for the features is defined as a plurality of polygons.

33. The method of claim 31, wherein the modified data for the features is defined as a plurality of edges.

* * * * *